United States Patent
Olsson et al.

(10) Patent No.: US 8,528,541 B2
(45) Date of Patent: Sep. 10, 2013

(54) SOLAR COLLECTION APPARATUS AND METHODS

(75) Inventors: Mark S. Olsson, La Jolla, CA (US); Ransom H. Byers, Needham, MA (US)

(73) Assignee: Seesean, Inc., San Diego, CA (US)

( * ) Notice: Subject to any disclaimer, the term of this patent is extended or adjusted under 35 U.S.C. 154(b) by 1866 days.

(21) Appl. No.: 11/342,396

(22) Filed: Jan. 30, 2006

(65) Prior Publication Data
US 2006/0201498 A1 Sep. 14, 2006

Related U.S. Application Data

(60) Provisional application No. 60/648,846, filed on Jan. 31, 2005.

(51) Int. Cl.
*F24J 2/38* (2006.01)

(52) U.S. Cl.
USPC ........... 126/605; 126/601; 126/569; 126/571; 126/690; 702/141

(58) Field of Classification Search
USPC ................. 126/601, 605, 573–578, 569, 571, 126/600, 690; 702/141
See application file for complete search history.

(56) References Cited

U.S. PATENT DOCUMENTS

| | | | | |
|---|---|---|---|---|
| 4,354,484 A * | 10/1982 | Malone et al. | | 126/602 |
| 4,440,150 A * | 4/1984 | Kaehler | | 126/602 |
| 6,284,968 B1 * | 9/2001 | Niesyn | | 136/246 |
| 6,704,607 B2 * | 3/2004 | Stone et al. | | 700/56 |
| 6,725,173 B2 * | 4/2004 | An et al. | | 702/141 |
| 6,842,153 B2 * | 1/2005 | Challoner | | 343/766 |
| 7,526,402 B2 * | 4/2009 | Tanenhaus et al. | | 702/151 |

OTHER PUBLICATIONS

Utveckling av styrning till solfojande MaReCo-hyrbrid 1 Hammarby Sjostad, Mikael Svensson, LITH-ISY-EX-3193-2002, Jul. 2, 2002 (pp. 1-94), Figures Only.

English Translation of portions of pp. 42 and 43 of the aforementioned Utveckling av styrning etc. referring to Fig. 3.18.

* cited by examiner

*Primary Examiner* — Avinash Savani
(74) *Attorney, Agent, or Firm* — Steven C. Tietsworth, Esq.

(57) ABSTRACT

A mirror or other reflecting surface is used for collecting and reflecting incident solar radiation. The mirror is supported for independent motion about a pair of axes. An accelerometer generates signals representative of an amount and direction of motion of the mirror about each of the axes. Motors or other drive mechanisms independently drive the mirror about each of the axes. A tracking device provides information about the current position of the Sun. A control is connected to the accelerometer, the motors and the tracking device for maintaining a predetermined optimum orientation of the mirror as the Sun moves across the sky.

18 Claims, 20 Drawing Sheets

SOLAR COLLECTION APPARATUS AND METHODS

CROSS-REFERENCE TO RELATED APPLICATION

This application claims benefit under 35 USC §119 and §120 of the filing date of U.S. Provisional Application Ser. No. 60/648,846 (now abandoned), which was filed by Mark S. Olsson on Jan. 31, 2005.

FIELD OF THE INVENTION

The present invention relates to systems and methods for utilizing the energy of the Sun, and more particularly, to systems and methods for tracking the Sun to re-direct and concentrate incident solar radiation for lighting, heating and photovoltaic applications.

BACKGROUND OF THE INVENTION

Increased usage of renewable energy sources such as solar radiation is important in reducing dependence upon foreign sources of oil and decreasing green house gases. Devices have been developed in the past that track the motion of the Sun to re-direct and concentrate incident solar radiation. FIG. 1 illustrates one example of a prior art device that utilizes a parabolic dish mirror 10 with a central axis 12 that is pointed generally toward the Sun 14. Incident solar radiation 22 is received and reflected by the parabolic dish mirror 10 and concentrated at its focus 16, where a thermal target (not illustrated) can be mounted so that it can be heated. The parabolic dish mirror 10 is supported for independent movement by a two-axis tracking support 18 mounted atop a supporting structure 20 such as a tower. Optical encoders (not illustrated) associated with the tracking support 18 provide signals indicative of the direction and amount of rotation of the parabolic dish mirror 10 so that motor drives and a control system (not illustrated) can be used to track the Sun and increase the efficiency of the energy transfer.

FIG. 2 illustrates another example of a prior art device similar to the device of FIG. 1 except that the device of FIG. 2 utilizes a parabolic trough mirror 30. Dashed line 32 illustrates a common plane of the focal line 36 of the parabolic trough mirror 30 and the Sun 14. A single axis tracking support 38 carries the parabolic trough mirror 30 and is mounted atop a tower 40. Incident light rays from the Sun such as 42 are collected and reflected by the parabolic trough mirror 30 and concentrated on a pipe (not illustrated) that extends along the focal line 36. This allows a heat transfer fluid such as water or liquid sodium to be heated. The heating efficiency can be improved by mechanisms (not illustrated) that cause the parabolic trough mirror 30 to pivot and track the Sun.

FIG. 3 illustrates another prior art device that utilizes a heliostat flat mirror 50 that receives incident light rays 52 from the Sun 14 and reflects them against a thermal target 58 atop a tower 59. Another tower 54 carries a two-axis tracking support 56 which supports a flat mirror 50. Drive and control mechanisms (not illustrated) allow the flat mirror 50 to be independently moved about a rotate axis 60 (azimuth) and about a tilt axis 62 (elevation) to ensure that the Sun's rays are reflected onto the target 58 as the Sun moves across the sky.

There are many variations of the foregoing devices, but to date, none has been widely adopted due to the complexity, reliability, accuracy and/or expense of the tracking mechanisms.

SUMMARY OF THE INVENTION

In accordance with the present invention a solar tracking apparatus has a mirror or other reflecting surface for collecting and reflecting incident solar radiation. The mirror is supported for independent motion about a pair of axes. An accelerometer generates signals representative of an amount and direction of motion of the mirror about each of the axes. Motors or other drive mechanisms independently drive the mirror about each of the axes. A tracking device provides information about the current position of the Sun. A control is connected to the accelerometer, the motors and the tracking device for maintaining a predetermined optimum orientation of the mirror as the Sun moves across the sky.

DETAILED DESCRIPTION

Figure 1:
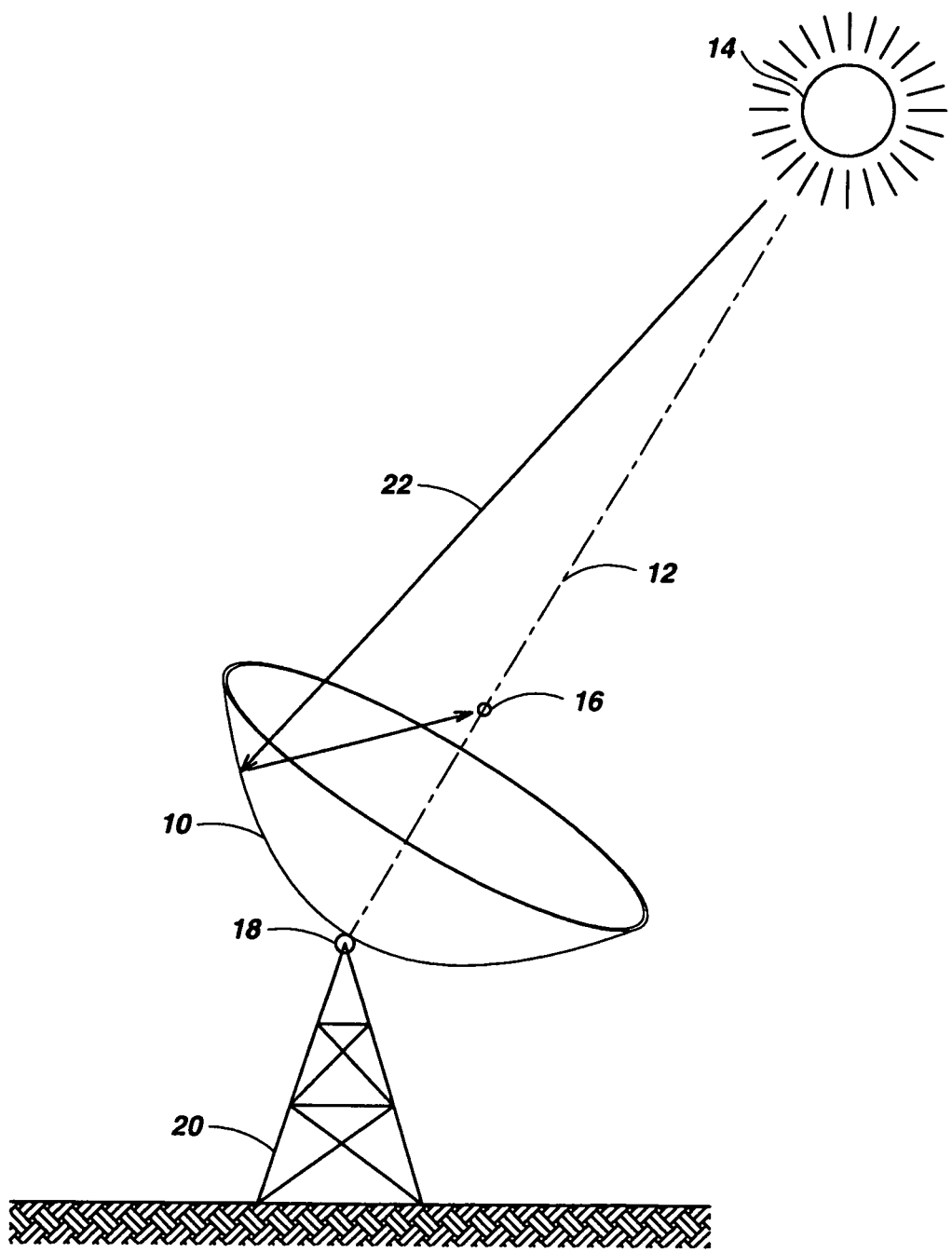
FIGS. 1-3 illustrate examples of prior art solar radiation collecting and redirecting devices.
Figure 2:
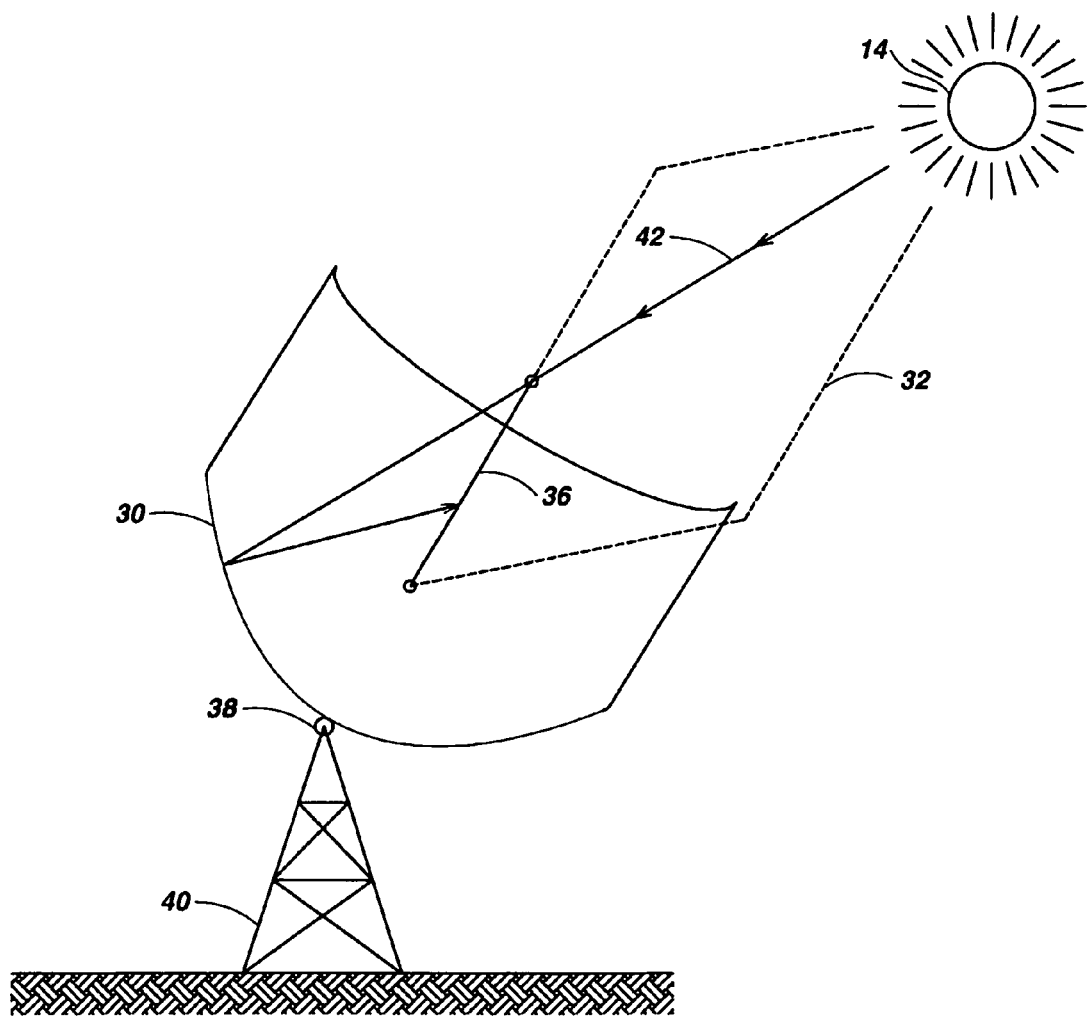
Figure 3:
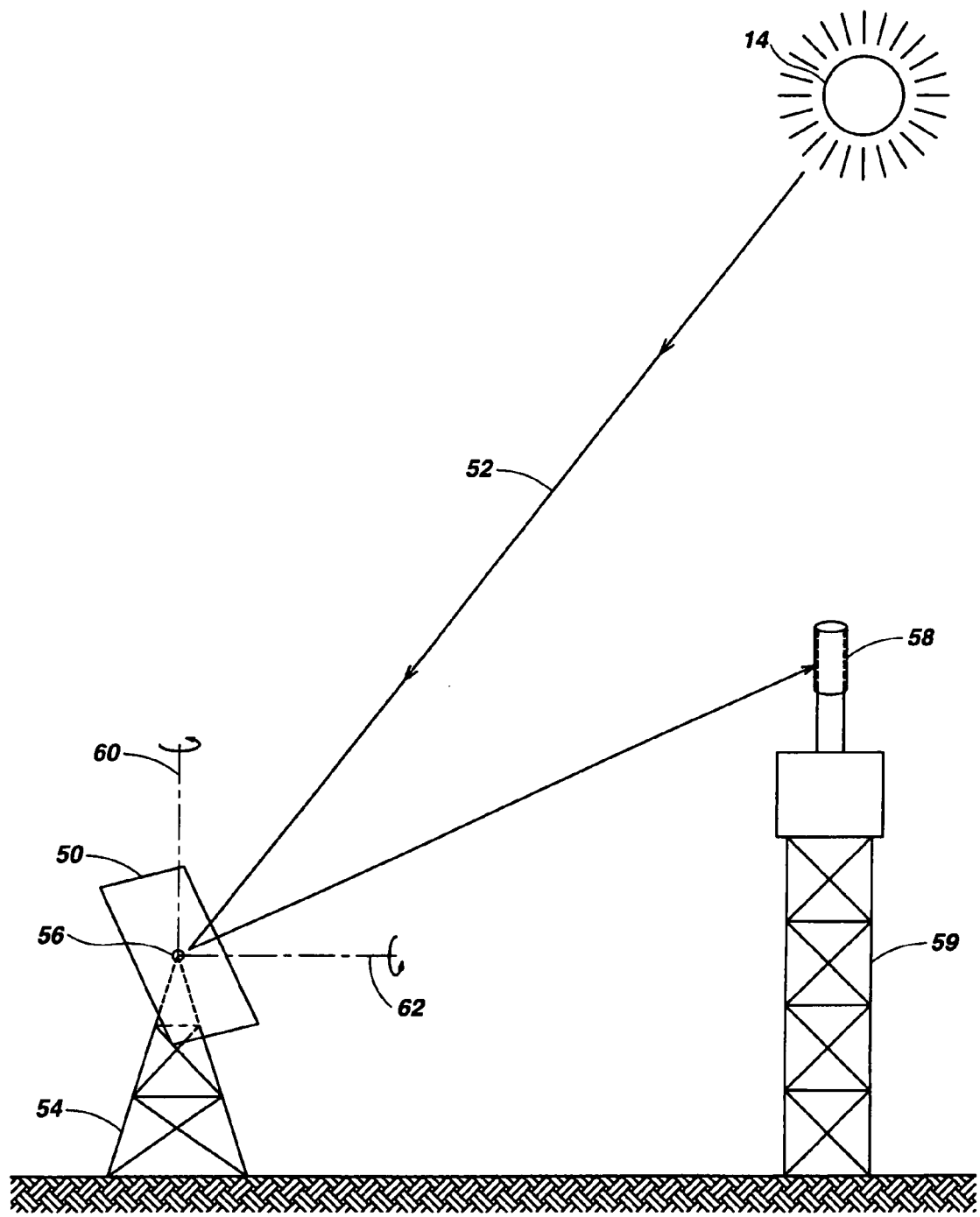
Figure 4:
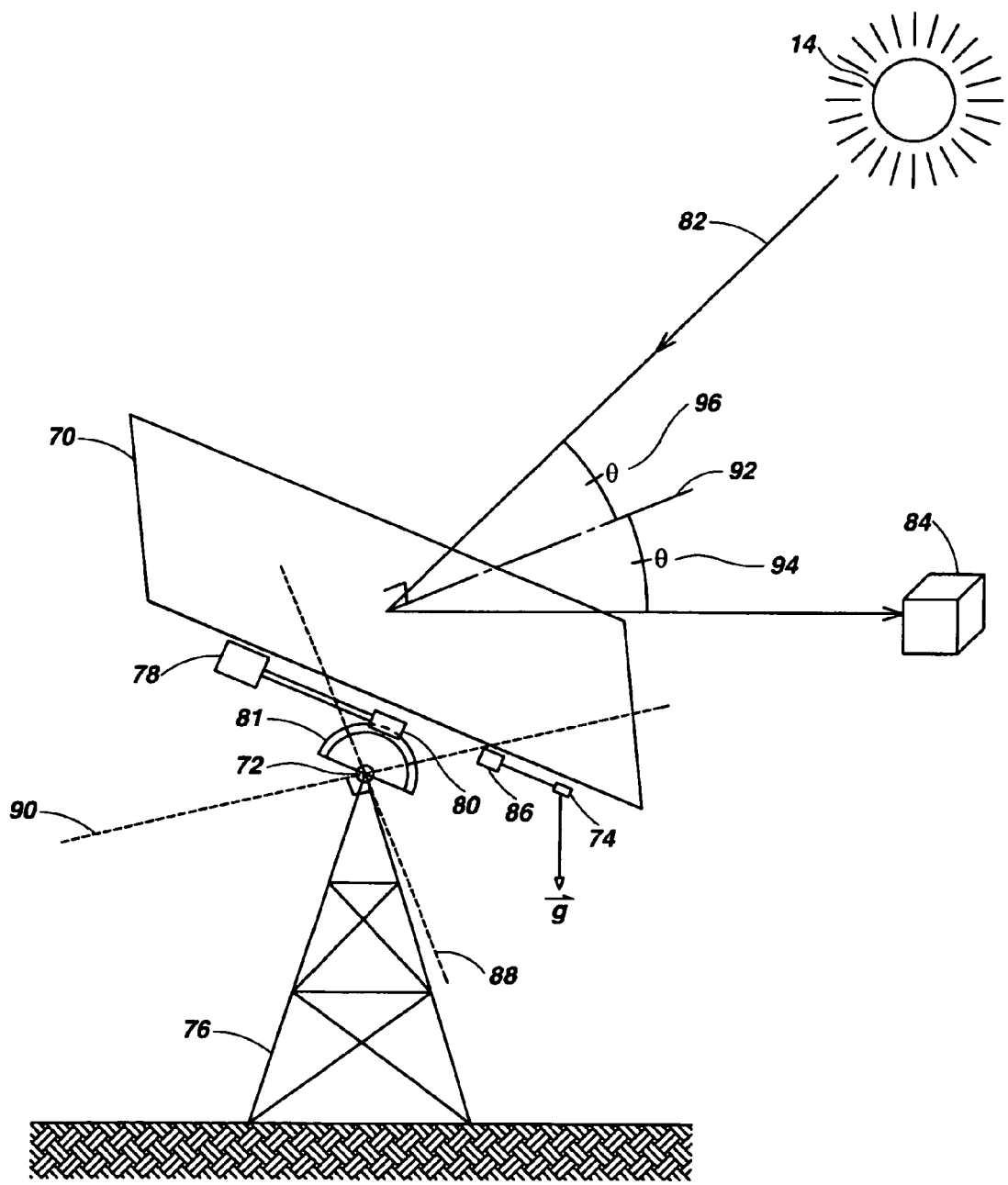
FIG. 4 illustrates a first embodiment of the present invention that utilizes a flat mirror to heat a target.

FIG. 4 illustrates a first embodiment of the present invention that utilizes a flat mirror to heat a target. A solar tracking apparatus has a mirror 70 or other reflecting surface for collecting and reflecting incident solar radiation 82 from the Sun 14. The mirror in this embodiment has a planar configuration, although this embodiment could be adapted to use other mirror configurations including parabolic dish, parabolic trough, etc. in order to concentrate the incident solar radiation. The mirror could be conventional silver coated glass, or could be plastic, or could be Mylar® polyester film on a support substrate, or some other form of reflective material that is durable, lightweight and inexpensive.

The mirror 70 (FIG. 4) is supported by a pair of pivot mechanisms 72 for independent motion about a pair of tilt axes 88 and 90. The pivot mechanisms 72 are mounted atop a support tower 76. An accelerometer 74 generates signals representative of an amount and direction of motion of the mirror about each of the axes 88 and 90. In effect the Earth's gravity is sensed and used to provide an indication of the current orientation of the mirror 70. Electric motors 78 (only one of two illustrated) independently drive the mirror 70 about each of the axes utilizing, for example, a worm gear 80 and a circular rack gear 81. A mirror controller network node 86 includes a tracking device, typically an electronic processor, that provides information about the current position of the Sun 14. The mirror controller network node 86 also includes a control that is connected to the accelerometer 74, the motors 78 and the tracking device for maintaining a predetermined optimum orientation of the mirror as the Sun moves across the sky. The architecture and method of operation of the mirror controller network node 86 are discussed hereafter in greater detail. Incident solar radiation with an angle of incidence 96 is reflected off the surface of the mirror 70 at an angle of reflection 94 so that it strikes a thermal target 84 such as a container or conduit of a heat transfer fluid or an array of photovoltaic cells.

The accelerometer 74 (FIG. 4) is preferably a micro-electro-mechanical systems (MEMS) accelerometer device. Utilizing micro-fabrication techniques a position sensor component and signal conditioning circuit can be fabricated on a single integrated circuit chip. Such MEMS accelerometer devices are relatively inexpensive, durable and sufficiently accurate for purposes of manufacturing commercial embodiments of the present invention. Suitable MEMS accelerometer devices are the KXM52-1040 dual-axis (XY) MEMS accelerometer device and the KXM52-1050 tri-axis (XYZ) MEMS accelerometer device, both of which are commercially available from Kionix, Inc., 36 Thronwood Drive, Ithica, N.Y. 14850 USA. See U.S. Pat. No. 6,149,190 granted Nov. 21, 2000 to Galvin et al. and U.S. Pat. No. 6,792,804 granted Sep. 21, 2004 to Adams et al., both of which are assigned to Kionix, Inc., the entire disclosures of which are hereby incorporated by reference. Also suitable are the ADXL321 (two-axis) and ADXL330 (three-axis) MEMS accelerometer devices, both of which are commercially available from Analog Devices, Inc., One Technology Way, Norwood, Mass. 02062 USA. See U.S. Pat. No. 6,837,107 granted Jan. 4, 2005 to Green and U.S. Pat. No. 6,845,665 granted Jan. 25, 2005 also to Green, both of which are assigned to Analog Devices, Inc., the entire disclosures of which are hereby incorporated by reference.

The pivot mechanisms 72 are configured and arranged so that throughout the useful range of tracking tilts, the accelerometer 74 is not rotated in an unknown fashion about a vertical axis. If the accelerometer is rotated about a vertical axis, the pointing direction of the mirror 70 becomes ambiguous or indeterminate.

It will be understood that a wide variation of modifications of the embodiment illustrated in FIG. 4 are possible. For example, the accelerometer 74 need not be directly mounted to the mirror but could be coupled thereto through a mechanical or optical linkage. The pivot mechanisms 72 could be replaced with ball and socket or flexible joints, instead of those employing independently movable mechanical pivots. Thus the mirror 70 need not strictly rotate about two axes, as is the case with the embodiment of FIG. 4 wherein rotation of the mirror 70 about one axis rotates the other axis. It will be appreciated that it is not necessary that both axes of tilt are substantially in the same horizontal plane when the mirror 70 is in a normal or horizontal orientation. Other forms of motor means for driving the mirror 70 can be employed besides the electric motor 78 and gears 80 and 81, such as hydraulic and pneumatic systems. The mirror 70 need not move in azimuth and elevation, it being sufficient that it be capable of independent movement about two non-parallel axes.

Figure 5:
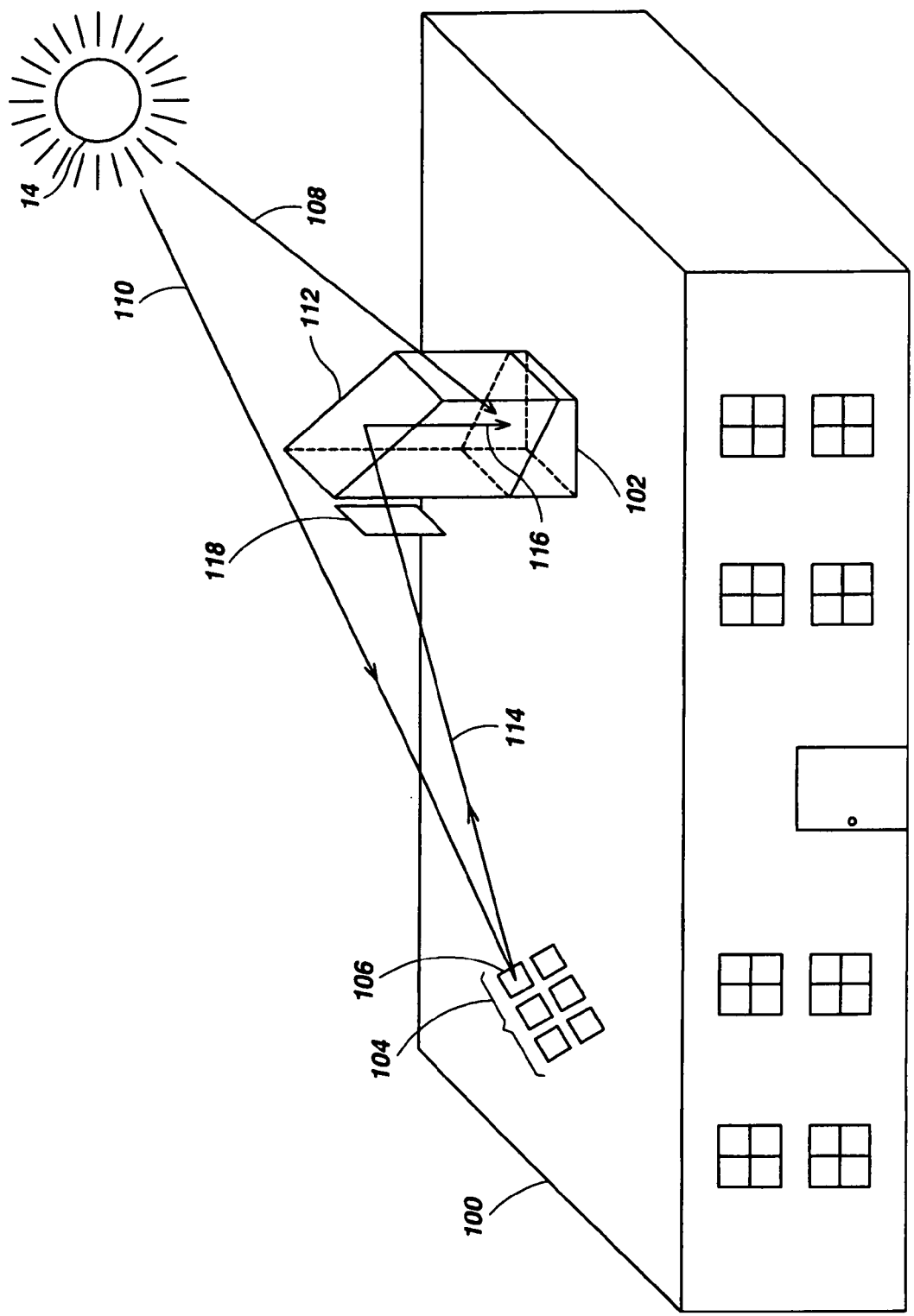
FIG. 5 illustrates a second embodiment of the present invention that utilizes an array of mirrors to reflect solar radiation through a skylight.

FIG. 5 illustrates a second embodiment of the present invention that utilizes an array 104 of individual mirrors 106 to reflect solar radiation 110 through a skylight 102 on the roof of a building 100 to provide internal lighting. This greatly increases the amount of solar radiation otherwise directly entering the interior of the building through the skylight 102 as illustrated by incident light rays 108. The mirrors 106 may each be independently supported and moved as illustrated in FIG. 4 or they may be simultaneously supported and moved by a common tracking system so that reflected light 114 strikes a fixed angle target mirror 112 and is reflected as downwardly projected light 116. The skylight 102 may be of the type sold under the SOLATUBE® trademark which employs a conduit with a highly reflective surface. Optionally a hot mirror 118 may be inserted into the reflected light transmission path to reflect away the infrared component during the Summer to avoid unwanted heating of the interior of the building 100.

Figure 6:
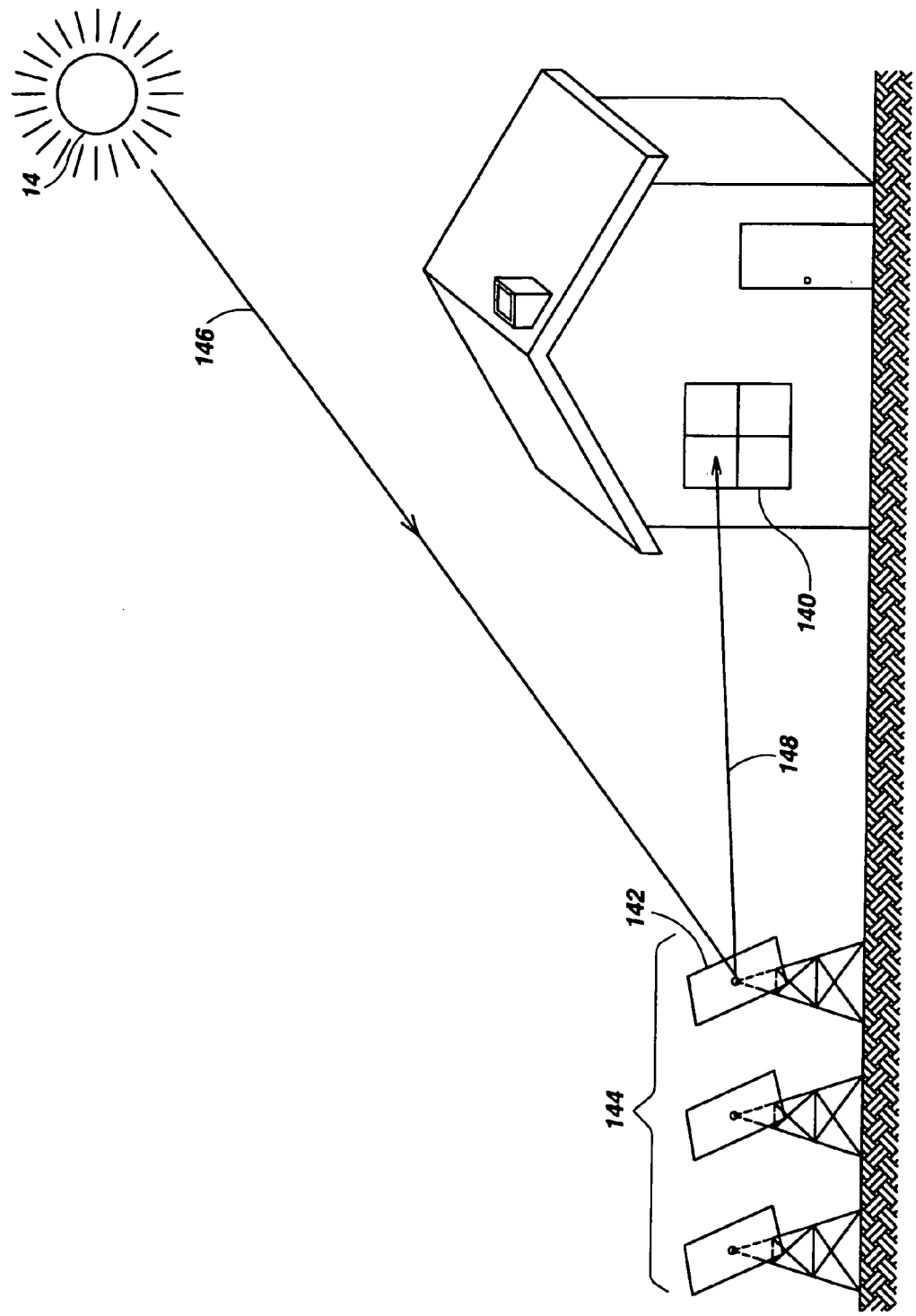
FIG. 6 illustrates an alternate embodiment wherein an array of flat tracking mirrors reflect incident solar radiation through the windows of a house to provide light and heat.

FIG. 6 illustrates an alternate embodiment wherein an array 144 of flat tracking mirrors 142 reflect incident solar radiation 146 as reflected radiation 148 that passes through the window 140 of a house to provide light and heat. Again the mirrors 142 are supported and moved in the fashion described in connection with FIG. 4.

Figure 7:
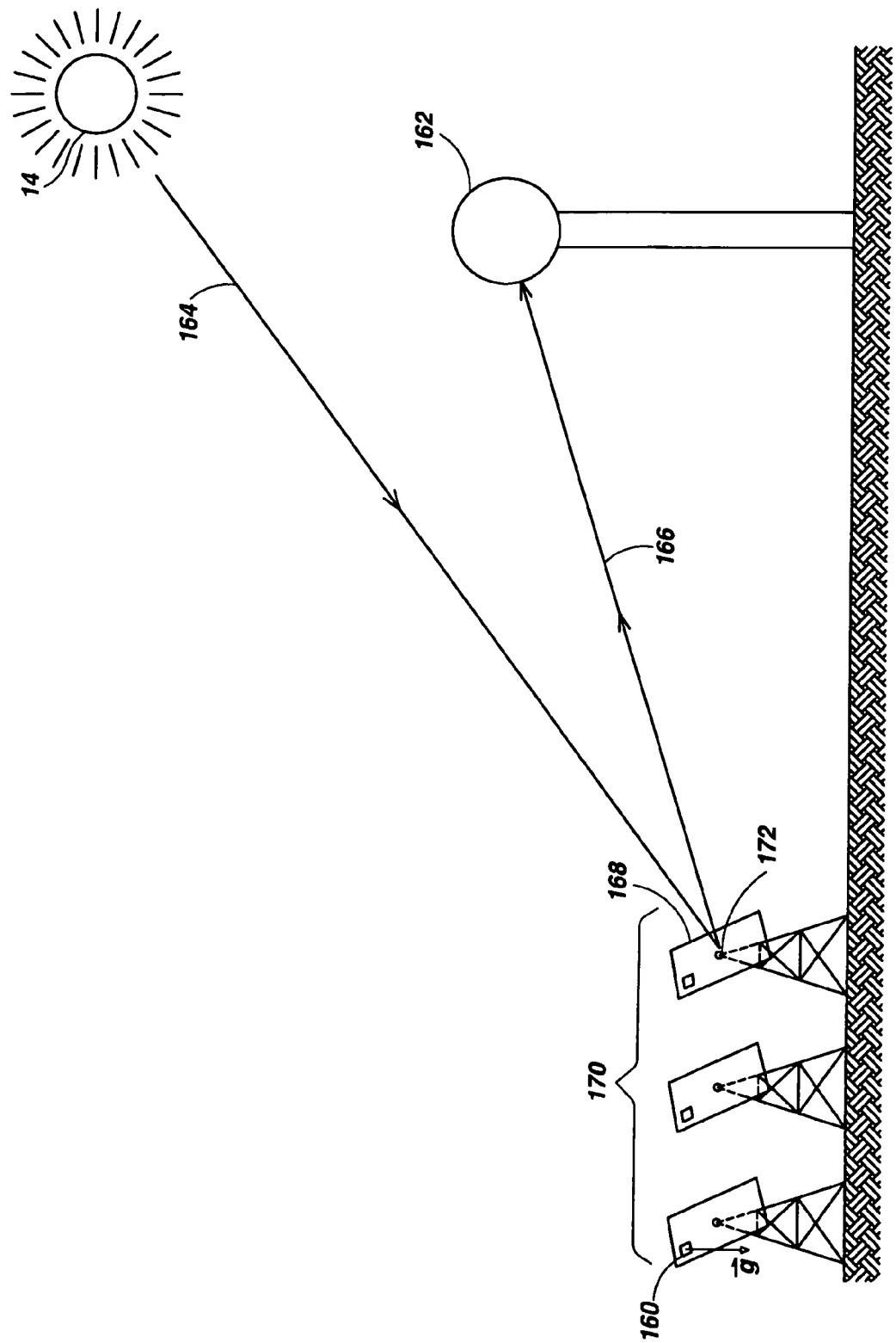
FIG. 7 illustrates another embodiment that utilizes an array of heliostat mirrors to heat a thermal target.

FIG. 7 illustrates another embodiment that utilizes an array 170 of heliostat mirrors 168 to heat a thermal target 162. The amount of incident solar radiation 164 that is redirected as reflected solar radiation 166 is maximized by mounting an accelerometer 160 on each heliostat mirror 168 and using its signals, along with tracking information to tilt each mirror 168 about its two-axis tilting support 172.

Figure 8:
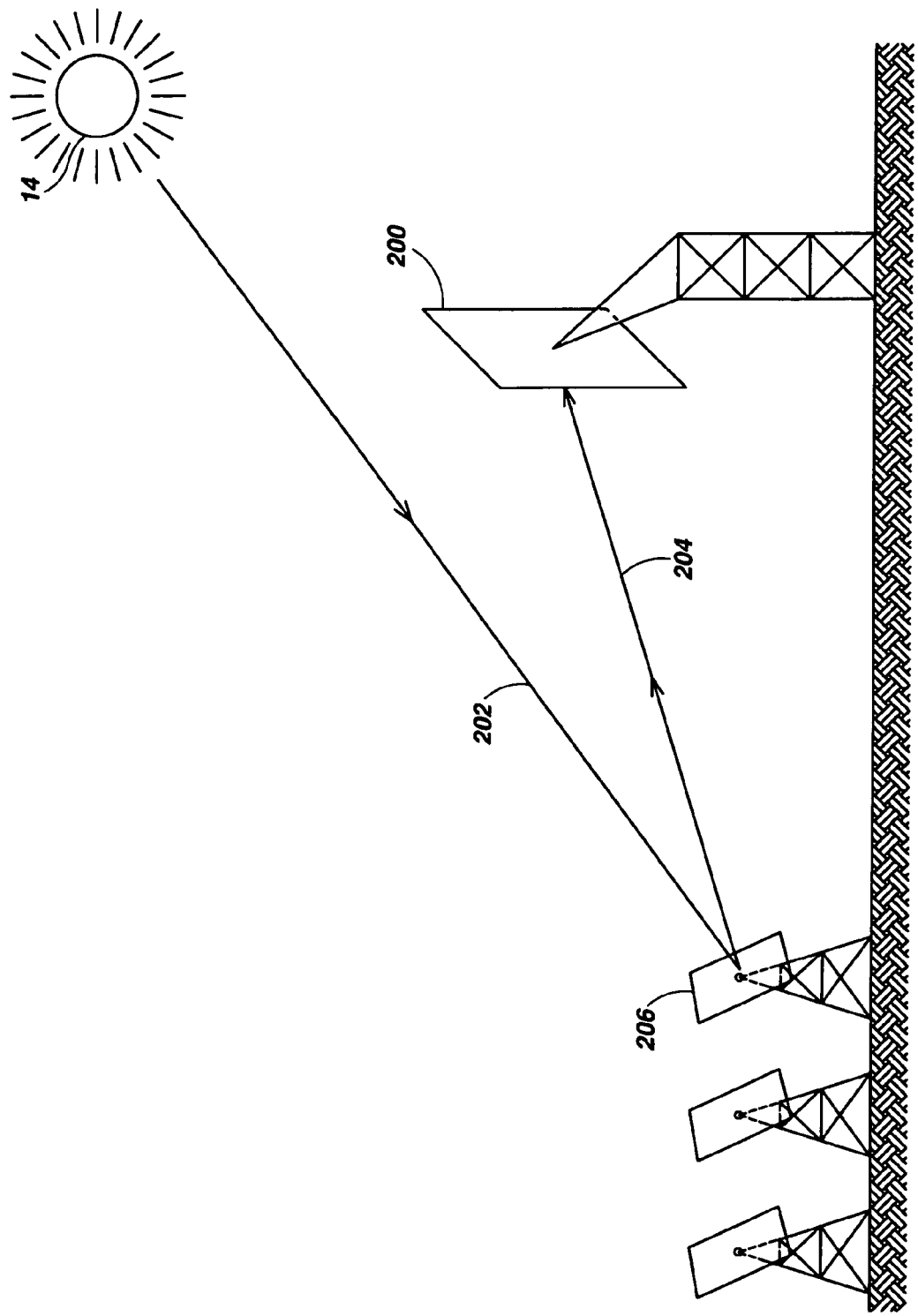
FIG. 8 illustrates another embodiment that utilizes a plurality of heliostat mirrors to reflect solar radiation onto a high temperature photovoltaic panel.

FIG. 8 illustrates another embodiment that utilizes a plurality of heliostat mirrors 206 equipped as described in connection with FIG. 4 in order to re-direct a maximum amount of incident solar radiation 202 as reflected radiation 204 onto a high temperature photovoltaic panel 200.

Figure 9:
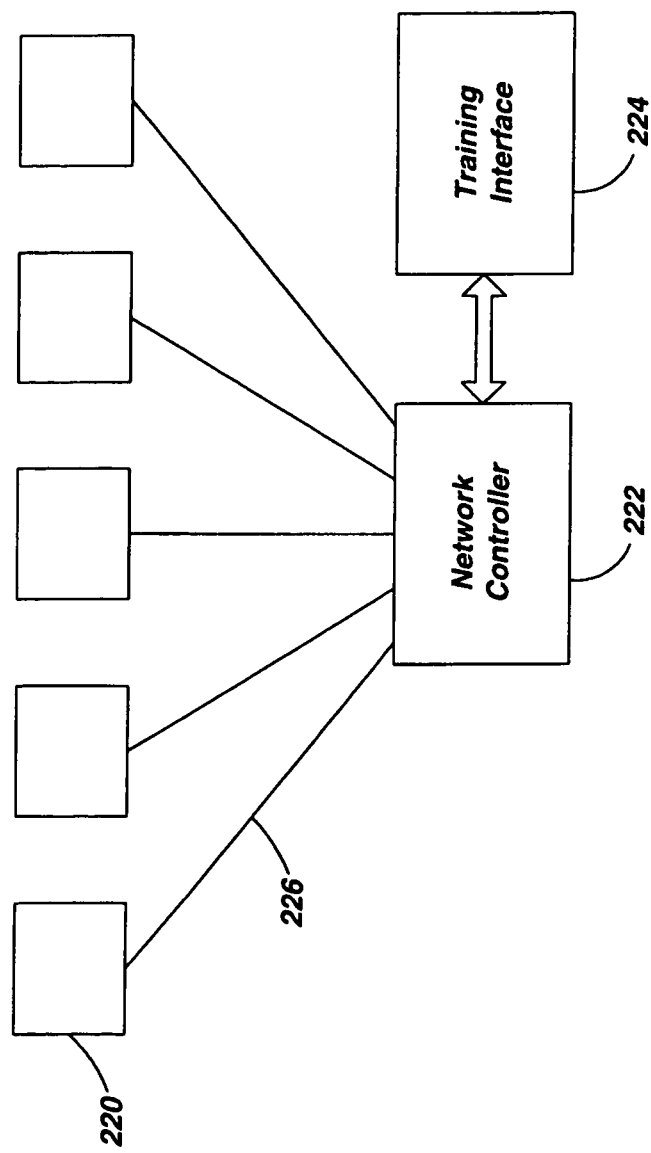
FIG. 9 is a block diagram of another embodiment in which a network controller controls a plurality of mirror nodes.

FIG. 9 is a block diagram of another embodiment in which a network controller 222 controls a plurality of mirror nodes 220. The network controller 222 may be connected to the mirror nodes 220 by a network link 226 which may be wired or wireless, fiber optic, laser or any other well known data communications scheme. One example is the ZIGBEE™ data link. An optional mirror node training interface 224 is provided that can be used to load the network controller 222 with tracking data from local or remote sources that give the predicted location of the Sun throughout the day for a given latitude, longitude, date and time. This information is used by the controller to compare the actual position of the mirrors with their optimum positions so that they can be moved to maximize the collection and/or concentration of solar radiation. Alternatively this information may be pre-programmed into the network controller 222 or the mirror controller network node 86 (FIG. 4). The present invention differs from conventional heliostats that require a vertical tracking axis. In the present invention, the Sun is tracked in both azimuth and elevation, however, tracking is required in both axes as neither component is separately derived.

Figure 10:
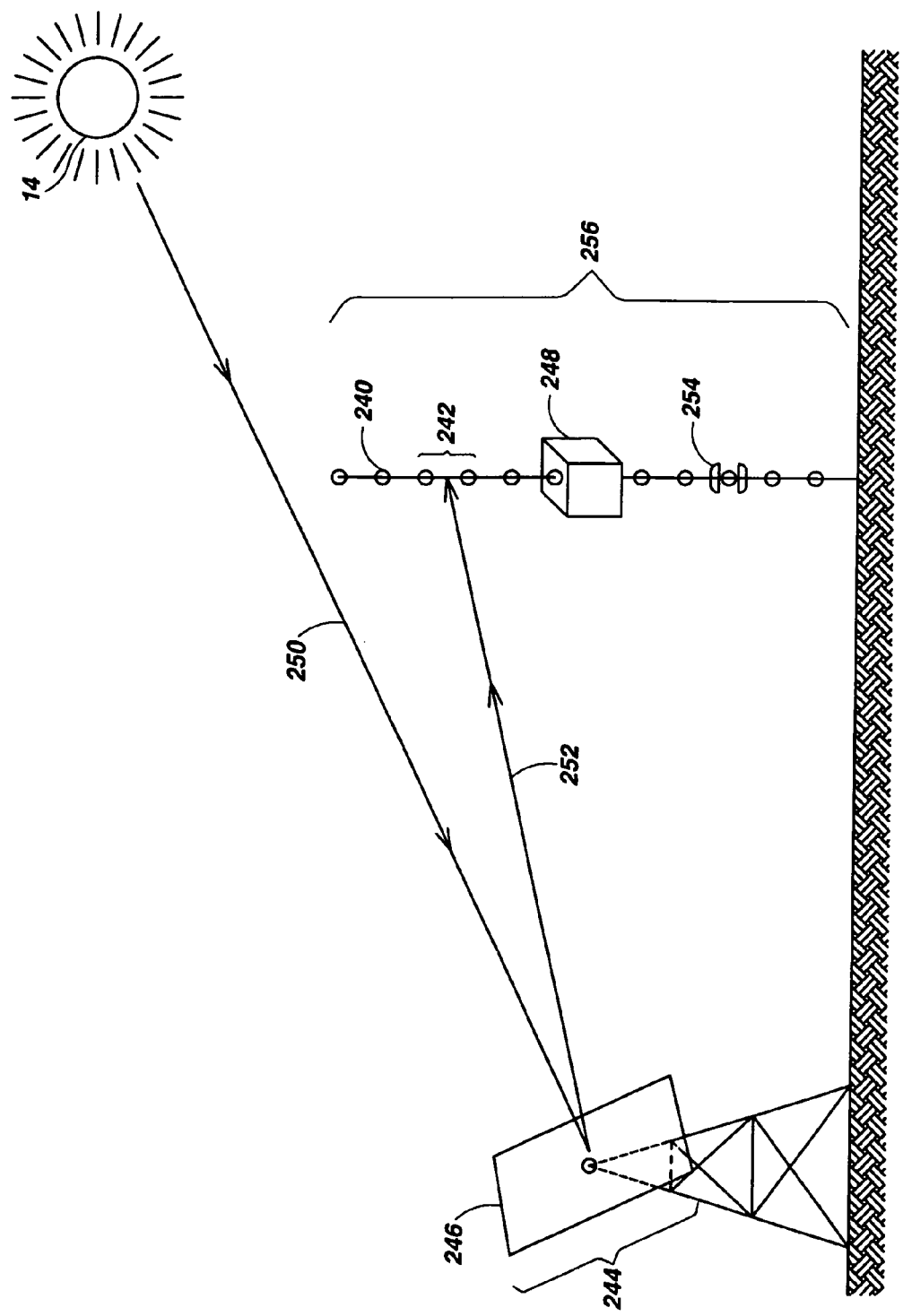
FIG. 10 illustrates another embodiment in which a heliostat mirror is positioned to reflect incident solar radiation onto a target via a vertical array of photo-sensors.

FIG. 10 illustrates another embodiment in which a heliostat mirror 246 is positioned to re-direct incident solar radiation 250 as reflected solar radiation 252 to strike a target 248 utilizing mechanisms similar to those described in connection with FIG. 4. A vertical array of photo-sensors 240 detect reflected radiation 252 and their signals are used to position the mirror 246 so that the reflected radiation will strike the target 248. A Sun hood 254 may be used with each photo-sensor 240 to prevent it from detecting significant amounts of incident solar radiation 250. The spacing 242 between the photo-sensors 240 can be optimized relative to the dimension 244 of the mirror 246.

Figure 11:
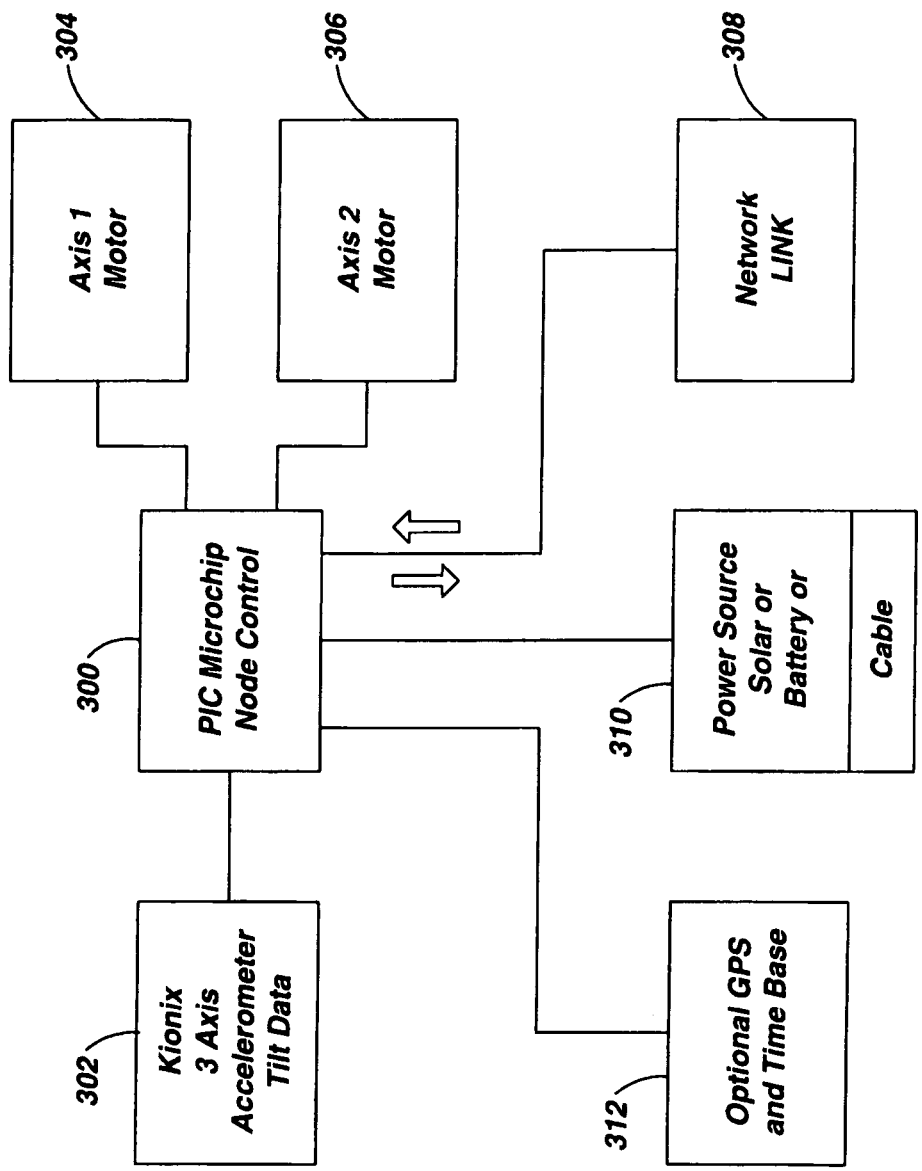
FIG. 11 is a block diagram illustrating one embodiment of the mirror controller network node of the embodiment of FIG. 4.

FIG. 11 is a block diagram illustrating one embodiment of mirror controller network node 86 of the embodiment of FIG. 4. A PIC micro-computer based control 300 provides the basic intelligence and control through appropriate input/output interfaces. Position information is received from the accelerometer 302. First and second axis motors 304 and 306 are appropriately driven. AC power or some other power source 310 such as solar or battery power provides power to the control 300. In order for the mirror to be optimally pointed, it is necessary for the control 300 to compare the actual position of the mirror to the current position of the Sun and make the appropriate adjustments. Data regarding the predicted location of the Sun is pre-programmed into the control 300, in which case a user interface (not illustrated) is necessary for a user to enter the correct latitude, longitude, date and time during initial set up. This interface could be a keypad or a connection to a PC or PDA, for example. Optionally, a Global Positioning System (GPS) and time base receiver 312 may be connected to the control 300 to provide this information. A wired or wireless network link 308 connects the control to a remote location for monitoring or control.

Figure 12:
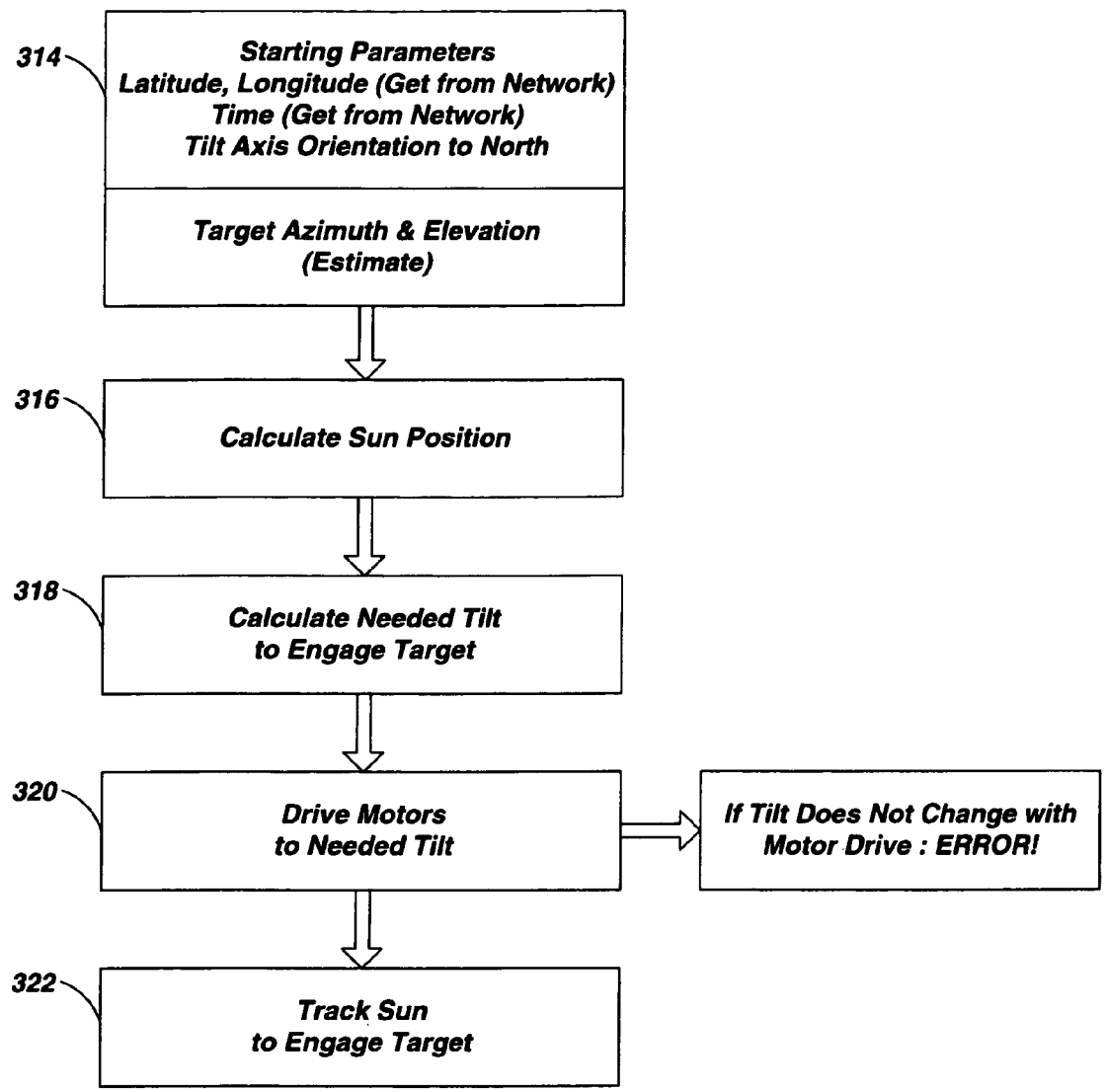
FIG. 12 is a flow diagram illustrating one embodiment of a method of operation of the control of FIG. 11.

FIG. 12 is a flow diagram illustrating one embodiment of a method of operation of the control of FIG. 11. Initially in step 314 the starting parameters are acquired, including latitude and longitude, time, tilt axis orientation to the North, and the estimated azimuth and elevation of the mirror. Latitude, longitude and time can be obtained via the network. In step 316 the processor calculates the position of the Sun. In step 318, using signals from the accelerometer, and data from a look up table, the control calculates the movement of the mirror about each axis necessary to achieve the optimum orientation. In step 320, the motors are driven by the control the move the mirror as needed to obtain the optimum orientation. If the accelerometer signals do not indicate mirror motion, an ERROR message is generated and transmitted and/or displayed. In step 322, the control continues to track the Sun in order to engage the target.

Figure 13:
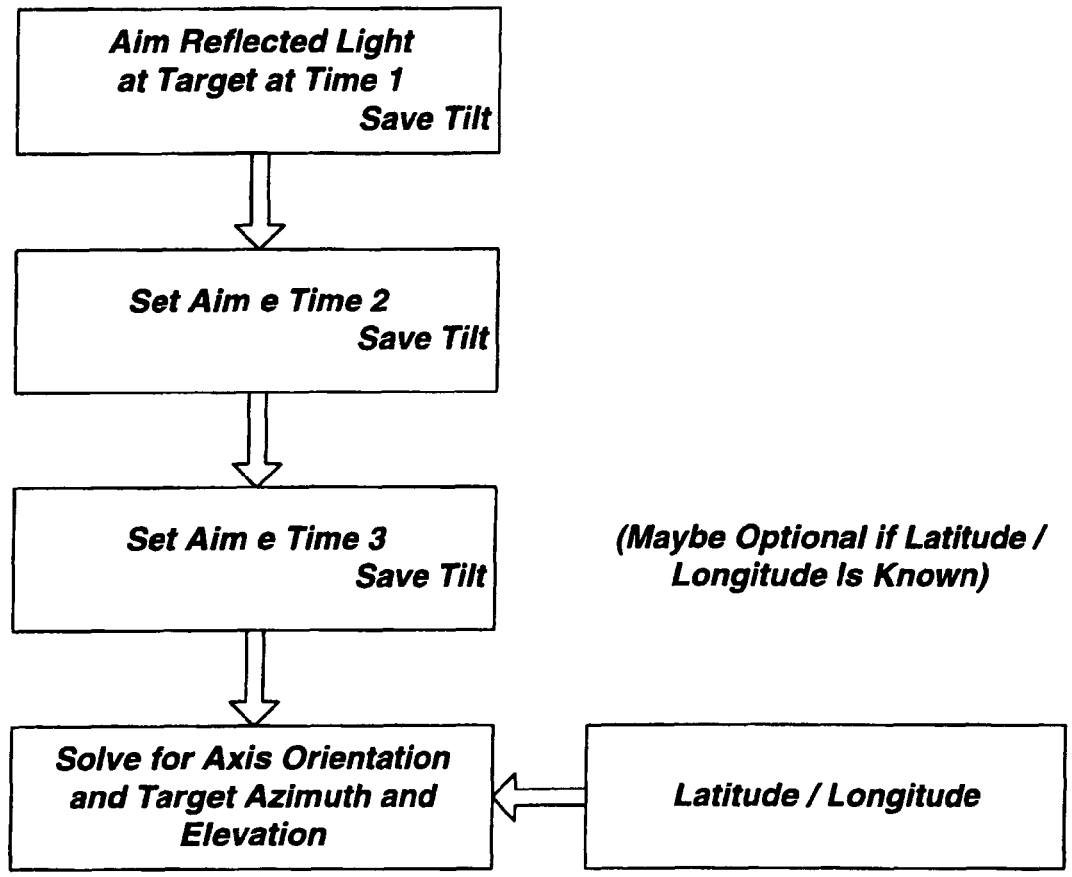
FIG. 13 is a flow diagram of another embodiment of a method of operation of a solar tracking device in accordance with the present invention.
Figure 14:
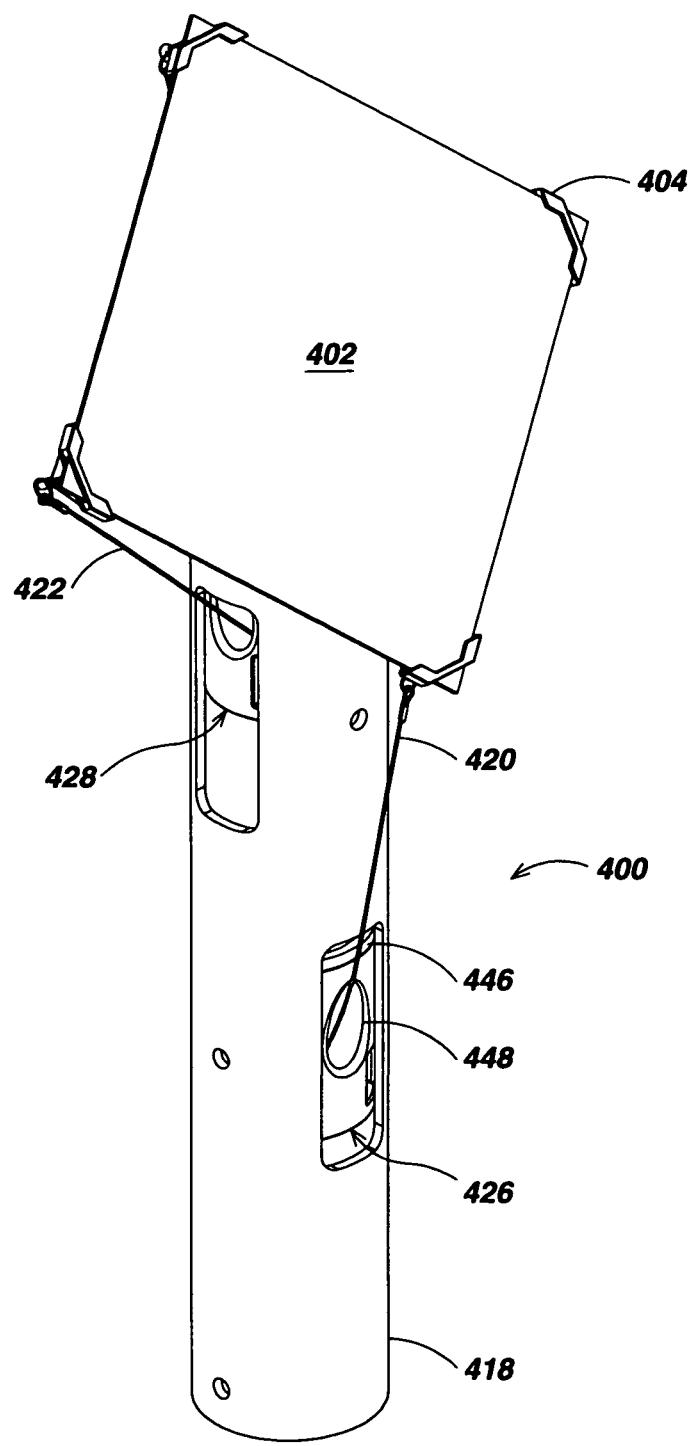
FIG. 14 is a front isometric view of another embodiment that utilizes a weight-tensioned device to pivot the mirror.
Figure 15:
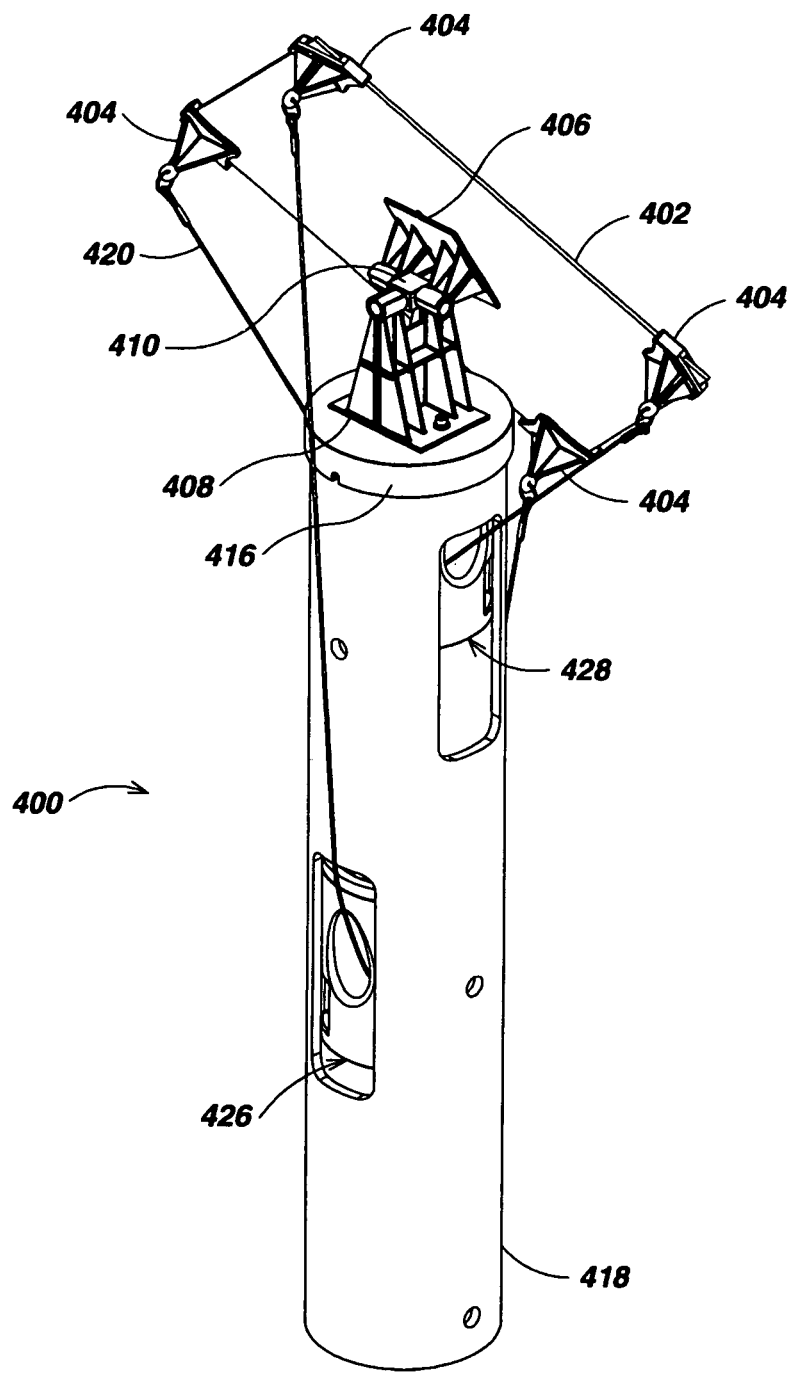
FIG. 15 is a back isometric view of the embodiment illustrated in FIG. 14.
Figure 16:
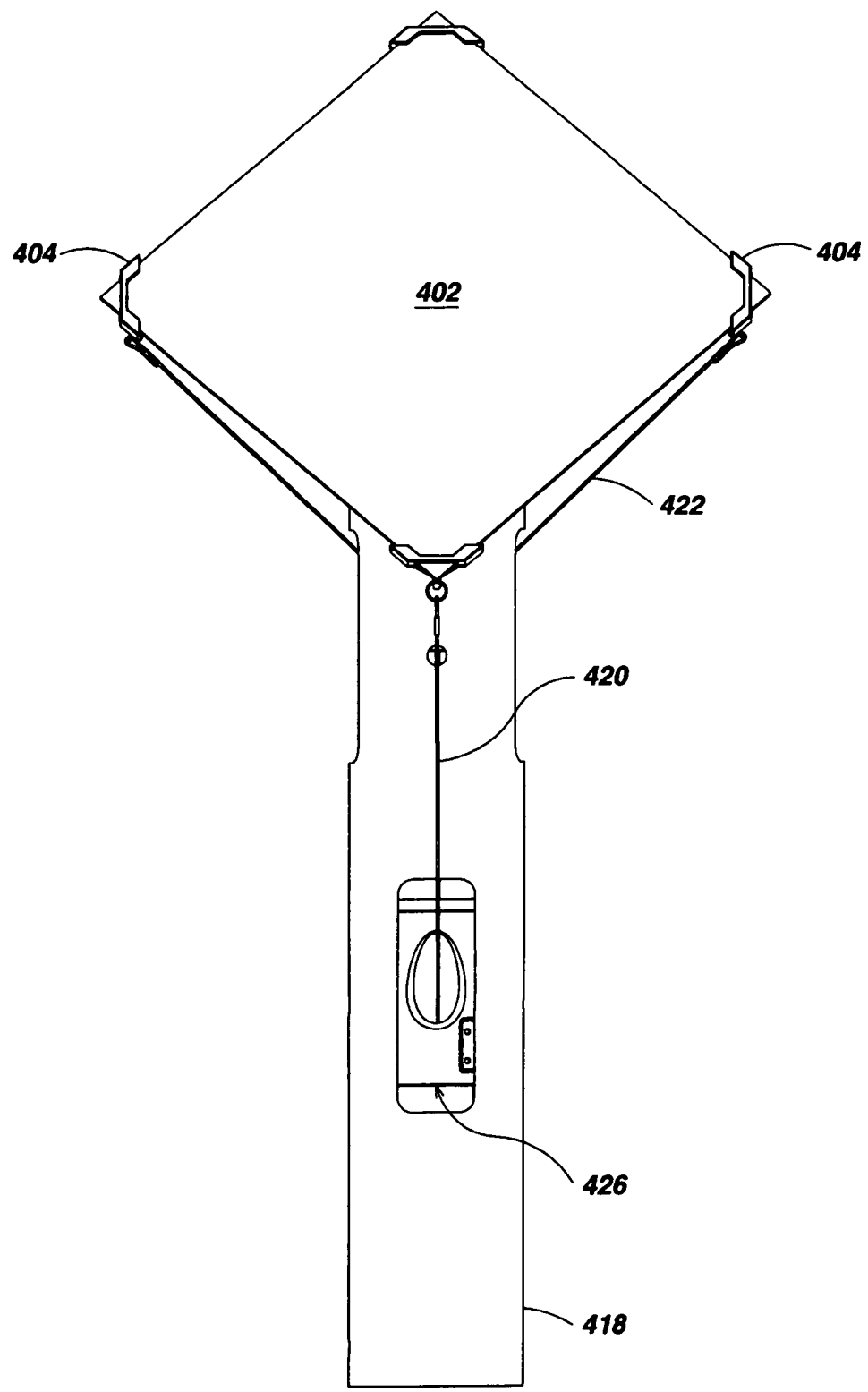
FIG. 16 is a front elevation view of the embodiment illustrated in FIG. 14.
Figure 17:
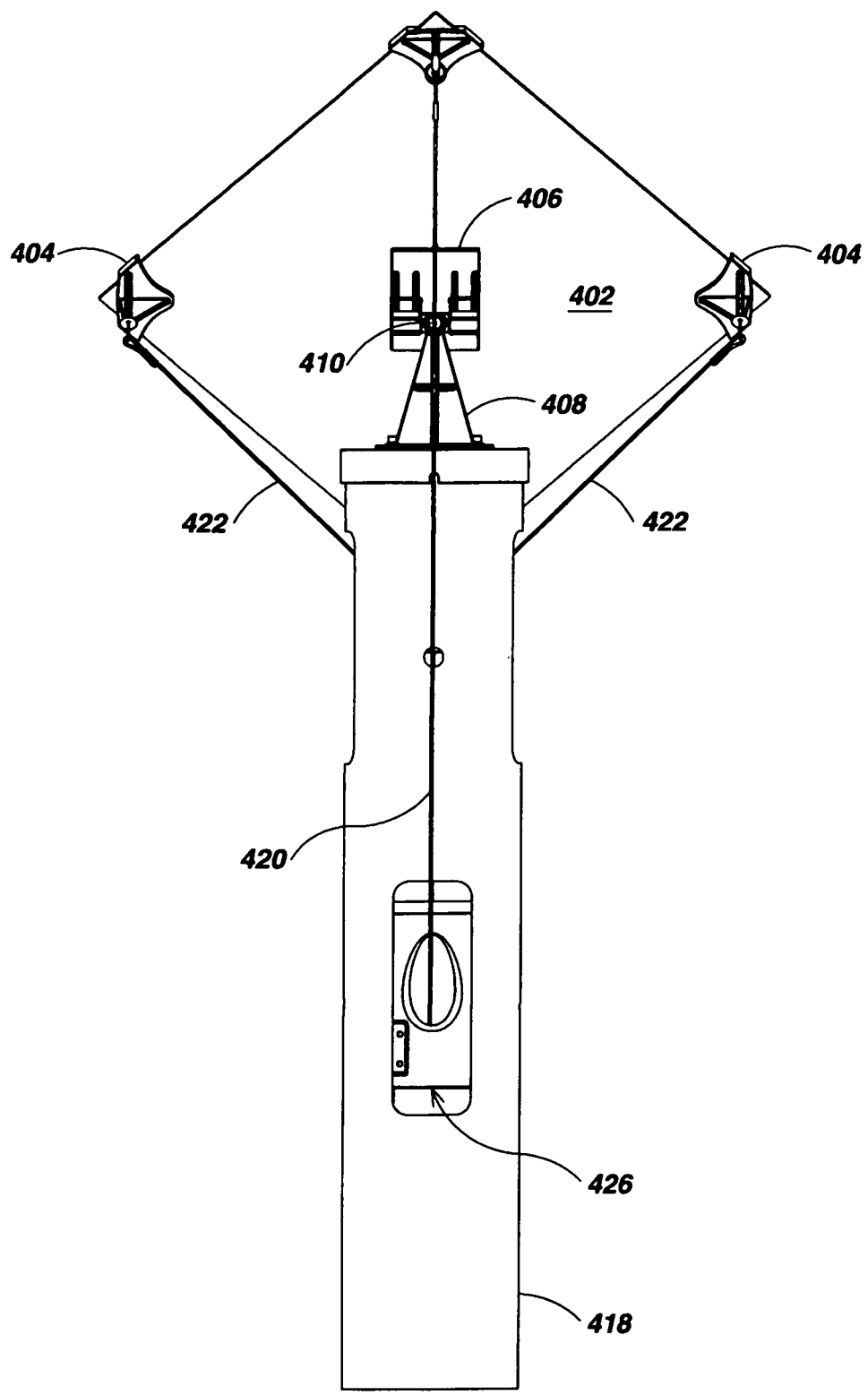
FIG. 17 is a back elevation view of the embodiment illustrated in FIG. 14.
Figure 18:
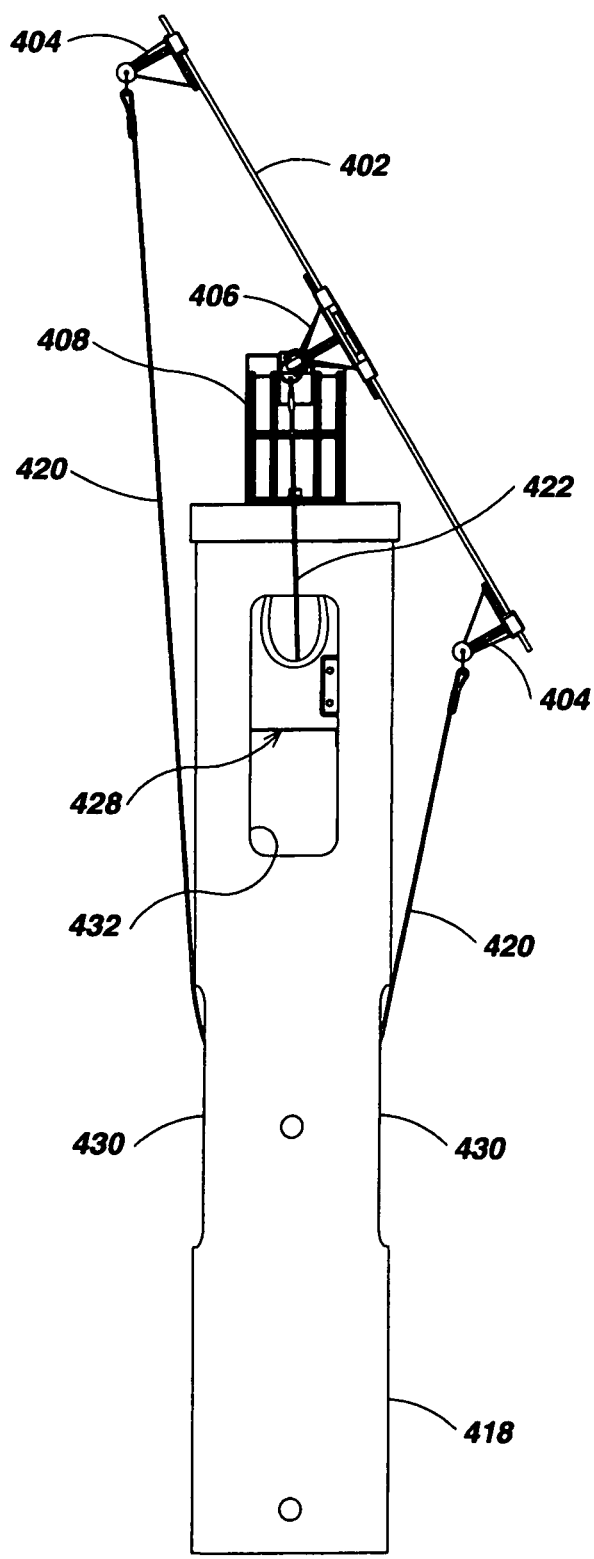
FIG. 18 is a side elevation view of the embodiment illustrated in FIG. 14.
Figure 19:
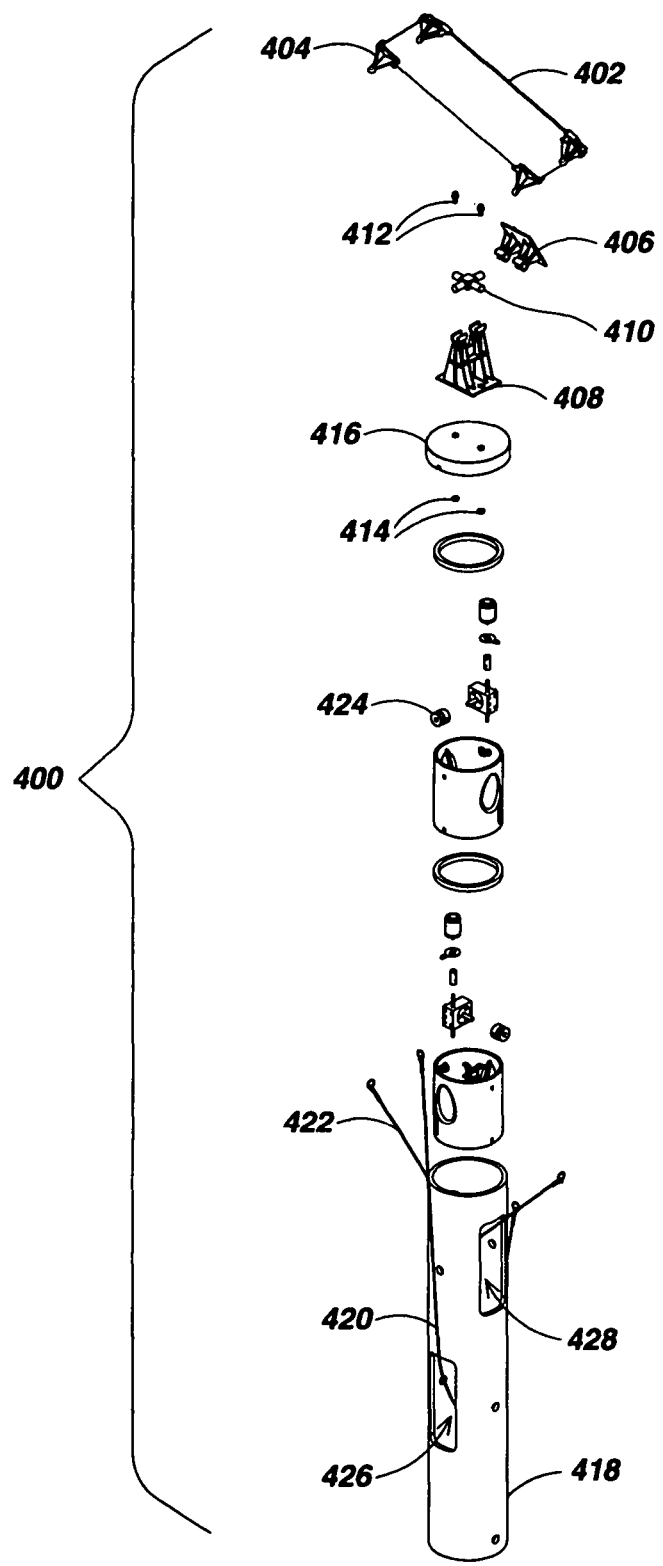
FIG. 19 is an exploded back isometric view of the embodiment illustrated in FIG. 14.

FIG. 13 is a flow diagram of another embodiment of a method of operation of a solar tracking device in accordance with the present invention.

FIGS. 14-20 illustrate another embodiment of the present invention that utilizes weight-tensioned mechanisms to pivot the mirror. The embodiment 400 includes a planar square mirror 402 whose corners are supported by four cable hook corners 404. A small yoke 406 (FIGS. 15 and 19) has a square surface which is secured to the center of the rear side of the mirror 402 by suitable adhesive. Small yoke 406 is connected for independent rotation about two axes to a tall yoke 408 by a cross piece 410. The base of the tall yoke 408 is secured by screws 412 and nuts 414 (FIG. 19) to a cylindrical cap plate 416. The cylindrical cap plate 416 is mounted on the upper end of a support structure in the form of a hollow vertical support post 418.

Figure 20:
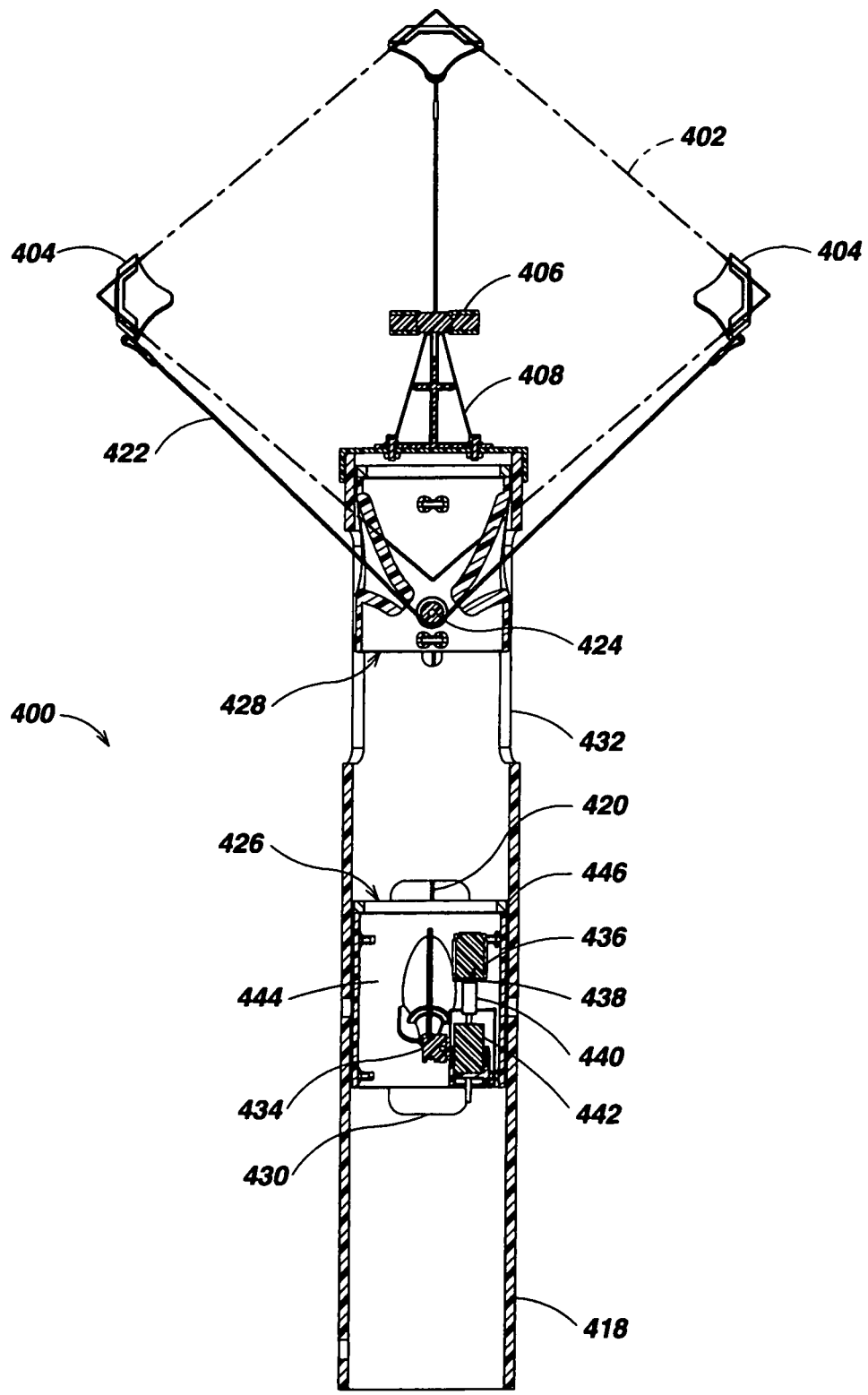
FIG. 20 is a vertical sectional view (stepped cut) of the embodiment illustrated in FIG. 14 showing internal components thereof.

A lower tension wire 420 (FIG. 18) has one end connected to the uppermost cable hook corner 404 and its other end connected to the lowermost cable hook corner 404. An upper tension wire 422 (FIGS. 18 and 19) has an intermediate segment wrapped around an upper drive pulley 424 (FIG. 20) and its ends connected to respective ones of the laterally spaced cable hook corners 404. The lower tension wire 420 is connected to a lower counter-weight drive assembly 426 (FIG. 20). The upper tension wire 422 is connected to an upper counter-weight drive assembly 428 on which the upper drive pulley 424 is mounted. The lower tension wire 420 passes through large rectangular apertures 430 (FIG. 18) on opposite sides of the lower portion of the support post 418. The upper tension wire 422 passes through large rectangular apertures 432 formed on opposite sides of the upper portion of the support post 418, and spaced ninety degrees from the apertures 430. The intermediate segment of the lower tension wire is wrapped around a lower drive pulley 434 (FIG. 20) mounted on the lower counter-weight drive assembly 426.

Each of the counter-weight drive assemblies 426 and 428 (FIG. 19) has a similar construction, and therefore, only one need be described. The lower counter-weight drive assembly 426 includes a lower micro-motor 436 (FIG. 20), a lower rotation restraint mechanism 438, a shaft connector 440, and a lower worm gear drive 442. These mechanisms allow the lower tension wire 420 to be driven by the lower drive pulley 434 to pivot the mirror 402 about a horizontal axis. Similar mechanisms in the upper counter-weight drive assembly 428 allow the upper drive pulley 424 to drive the upper tension wire back and forth to pivot the mirror 402 about a tilted (off vertical) axis. The lower counter-weight drive assembly 426 includes a cylindrical drive mount 444 (FIG. 20) and a ring-shaped counter-weight 446. The cylindrical drive mount 444 has oval apertures 448 (FIG. 14) formed on opposite sides thereof to allow ingress and egress of the lower tension wire 420.

The lower and upper counter-weight drive assemblies 426 and 428 are capable of reciprocal vertical motion within the bore of the support post 418. A control circuit (not illustrated) receives input from a MEMS accelerometer as previously described and causes the micro-motors of the lower and upper counter-weight drive assemblies 426 and 428 to move the mirror 402 into the optimum position for reflecting solar radiation onto a target (not illustrated in FIGS. 14-20), such as a photovoltaic array, heat exchanger, etc.

While several preferred embodiments of the present invention have been described, and some variations thereof, further modifications will occur to those skilled in the art. Therefore the protection afforded the subject in invention should only be limited in accordance with the following claims.

What is claimed is:

1. A solar tracking apparatus, comprising:
   means for collecting and reflecting incident solar radiation;
   means for supporting the solar radiation collecting and reflecting means for independent motion about a pair of non-vertical axes;
   accelerometer means for generating signals representative of an amount and direction of motion of the solar radiation collecting and reflecting means about each of the non-vertical axes;
   motor means for independently driving the solar radiation collecting and reflecting means about each of the non-vertical axes;

tracking means for providing information about the current position of the Sun; and control means connected to the accelerometer means, the motor means and the tracking means for maintaining a predetermined optimum orientation of the solar radiation collecting and reflecting means as the Sun moves across the sky.

2. The solar tracking apparatus of claim 1 wherein the solar radiation collecting and reflecting means is configured for concentrating incident solar radiation.

3. The solar tracking apparatus of claim 1 wherein the accelerometer means is mounted on the solar radiation collecting and reflecting means.

4. The solar tracking apparatus of claim 1 wherein the support means includes a pair of pivot mechanisms.

5. The solar tracking apparatus of claim 1 wherein the accelerometer means includes a MEMS accelerometer device.

6. The solar tracking apparatus of claim 1 wherein the motor means includes first and second electric motors and first and second drive linkages for coupling the electric motors, respectively, to the support means.

7. The solar tracking apparatus of claim 1 wherein the solar radiation collecting and reflecting means is supported so that both axes are substantially in the same horizontal plane when the solar radiation collecting and reflecting means is in a horizontal orientation.

8. The solar tracking apparatus of claim 7 wherein the solar radiation collecting and reflecting means is a mirror with a planar configuration.

9. The solar tracking apparatus of claim 7 wherein the solar radiation collecting and reflecting means is a mirror with a parabolic dish configuration.

10. The solar tracking apparatus of claim 7 wherein the solar radiation collecting and reflecting means is a mirror with a parabolic trough configuration.

11. The solar tracking apparatus of claim 1 wherein the Sun is tracked in both azimuth and elevation components with neither component separately derived.

12. The solar tracking apparatus of claim 1 wherein the control means includes a control node for comparing a position of the solar radiation collecting and reflecting means to a current position of the Sun and adjusting, responsive to the comparing, the current position of the solar radiation collecting and reflecting means.

13. The solar tracking apparatus of claim 4 wherein the pivot mechanisms are configured and arranged so that throughout a useful range of tracking tilts the accelerometer means is not rotated in an unknown fashion about a vertical axis.

14. The solar tracking apparatus of claim 1 wherein the solar radiation collecting and reflecting means comprises a mirror, the apparatus further including a first tension wire having opposition ends connected to a first pair of opposition locations on the mirror and a second tension wire having opposition ends connected to a second pair of opposition locations on the mirror, wherein the mirror is moved by driving the first and second tension wires.

15. The solar tracking apparatus of claim 1 wherein the accelerometer means is coupled to the solar radiation collecting and reflecting means through a mechanical or optical linkage.

16. A solar tracking apparatus, comprising:
a solar reflector for collecting and reflecting solar energy;
a control node;
a pair of motors coupled to the control node;
supporting apparatus coupled to the motors for independently moving the solar reflector about a pair non-vertical axes in response to control signals provided to the motors from the control node;
an accelerometer having an output coupled to the control node for providing multi-axis information associated with a position or motion of the supporting apparatus about the each of the non-vertical axes;
an electronic module for providing data associated with a current position of the Sun to the control node;
wherein the control node receives the data associated with the current position of the Sun and the accelerometer output, and provides the control signals, wherein the control signals are based in part on the accelerometer output and the data associated with the current position of the sun, to the motors to maintain a predetermined optimum orientation of the solar reflector as the Sun moves across the sky.

17. The solar tracking apparatus of claim 16 wherein the electronics module for providing data associated with a current position of the Sun comprises a GPS module.

18. The solar tracking apparatus of claim 16 wherein the control node calculates the position of the Sun based at least in part on the data provided from the electronics module and adjusts the reflector based at least in part on the accelerometer output to toe optimum orientation.

* * * * *

UNITED STATES PATENT AND TRADEMARK OFFICE
CERTIFICATE OF CORRECTION

| | | |
|---|---|---|
| PATENT NO. | : 8,528,541 B2 | Page 1 of 1 |
| APPLICATION NO. | : 11/342396 | |
| DATED | : September 10, 2013 | |
| INVENTOR(S) | : Mark S. Olsson and Ransom H. Byers | |

It is certified that error appears in the above-identified patent and that said Letters Patent is hereby corrected as shown below:

On the Title Page

(73) Assignee should read: SeeScan, Inc., San Diego, CA (US)

Signed and Sealed this
Twenty-fifth Day of August, 2015

Michelle K. Lee
*Director of the United States Patent and Trademark Office*